(12) United States Patent
Li et al.

(10) Patent No.: US 12,087,857 B2
(45) Date of Patent: Sep. 10, 2024

(54) SEMICONDUCTOR DEVICE AND METHOD FOR MANUFACTURING THE SAME

(71) Applicant: CHANGXIN MEMORY TECHNOLOGIES, INC., Hefei (CN)

(72) Inventors: Yukun Li, Hefei (CN); Tao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 405 days.

(21) Appl. No.: 17/404,114

(22) Filed: Aug. 17, 2021

(65) Prior Publication Data

US 2022/0059695 A1 Feb. 24, 2022

Related U.S. Application Data

(63) Continuation of application No. PCT/CN2021/097750, filed on Jun. 1, 2021.

(30) Foreign Application Priority Data

Aug. 21, 2020 (CN) .......................... 202010848727.0

(51) Int. Cl.
*H01L 29/78* (2006.01)
*H01L 21/265* (2006.01)
(Continued)

(52) U.S. Cl.
CPC .... *H01L 29/7827* (2013.01); *H01L 21/26533* (2013.01); *H01L 21/823412* (2013.01);
(Continued)

(58) Field of Classification Search
None
See application file for complete search history.

(56) References Cited

U.S. PATENT DOCUMENTS

| 5,994,736 A | 11/1999 | Sugawara |
| 6,171,916 B1 | 1/2001 | Sugawara |

(Continued)

FOREIGN PATENT DOCUMENTS

| CN | 1855429 A | 11/2006 |
| CN | 102693915 A | 9/2012 |

(Continued)

OTHER PUBLICATIONS

Supplementary European Search Report in the European application No. 21857280.8, mailed on Jan. 18, 2024. 9 pages.

*Primary Examiner* — Alexander G Ghyka
(74) *Attorney, Agent, or Firm* — Kilpatrick Townsend & Stockton LLP

(57) ABSTRACT

The application provides a method for manufacturing a semiconductor device. The method includes the following operations. A semiconductor substrate is provided, a plurality of separate trenches being formed in the semiconductor substrate. Plasma injection is performed to form a barrier layer between adjacent trenches A respective gate structure is formed in each of the plurality of trenches. A plurality of channel regions are formed in the semiconductor substrate, each of the plurality of trenches corresponding to a respective one of the plurality of channel regions. A source/drain region is formed between each of the plurality of trenches and the barrier layer, the source/drain region being electrically connected to the respective one of the plurality of channel regions, and a conductive type of the barrier layer is opposite to a conductive type of the source/drain region.

13 Claims, 10 Drawing Sheets

(51) Int. Cl.
*H01L 21/8234* (2006.01)
*H01L 27/088* (2006.01)
*H01L 29/10* (2006.01)
*H01L 29/423* (2006.01)

(52) U.S. Cl.
CPC ............. *H01L 21/823418* (2013.01); *H01L 21/823437* (2013.01); *H01L 21/823493* (2013.01); *H01L 27/088* (2013.01); *H01L 29/1037* (2013.01); *H01L 29/4236* (2013.01); *H01L 29/7834* (2013.01)

(56) References Cited

U.S. PATENT DOCUMENTS

| 7,189,617 | B2 | 3/2007 | Slesazeck |
| 2006/0097314 | A1 | 5/2006 | Uchiyama |
| 2006/0234451 | A1 | 10/2006 | Slesazeck |
| 2013/0320512 | A1* | 12/2013 | Irsigler ............... H01L 21/2236 |
| | | | 257/E21.135 |

FOREIGN PATENT DOCUMENTS

| CN | 108321188 A | 7/2018 |
| EP | 1205980 A1 | 5/2002 |

* cited by examiner

SEMICONDUCTOR DEVICE AND METHOD FOR MANUFACTURING THE SAME

CROSS-REFERENCE TO RELATED APPLICATIONS

This is a continuation application of International Patent Application No. PCT/CN2021/097750, filed on Jun. 1, 2021, which claims priority to China Patent Application No. 202010848727.0, filed on Aug. 21, 2020 to the State Intellectual Property Office of China and entitled "SEMICONDUCTOR DEVICE AND METHOD FOR MANUFACTURING THE SAME", the disclosures of which are hereby incorporated by reference in their entireties.

BACKGROUND

With semiconductor technologies evolve to a high integration level, more and more transistor devices are integrated in chips with an unchanged size. In a related layout of integrated circuits, a gate of a transistor is arranged on a silicon substrate, a channel length is defined according to photoetching, a source and a drain are generated by oblique incidence, and the transistor devices are mainly isolated from one another by silicon oxide shallow trenches.

SUMMARY

The disclosure relates to the field of semiconductor manufacturing, and particularly to a semiconductor device and a method for manufacturing the same.

The disclosure provides a method for manufacturing a semiconductor device, and the method includes the following operations. A semiconductor substrate is provided, a plurality of separate trenches being formed in the semiconductor substrate. Plasma implantation is performed to form a barrier layer between adjacent trenches. A respective gate structure is formed in each of the plurality of trenches. A plurality of channel regions are formed in the semiconductor substrate, each of the plurality of trenches corresponding to a respective one of the plurality of channel regions. A source/drain region is formed between each of the plurality of trenches and the barrier layer, the source/drain region being electrically connected to the respective one of the plurality of channel regions, and a conductive type of the barrier layer being opposite to a conductive type of the source/drain region.

The disclosure further provides a semiconductor device, the semiconductor device includes: a semiconductor substrate, a plurality of separate trenches being formed in the semiconductor substrate; a barrier layer formed between adjacent trenches by a plasma implantation process; a respective gate structure formed in each of the plurality of trenches; a plurality of channel regions formed in the semiconductor substrate, each of the plurality of trenches corresponding to a respective one of the plurality of channel regions; and a source/drain region formed between each of the plurality of trenches and the barrier layer and electrically connected to the respective one of the plurality of channel regions, and a conductive type of the barrier layer being opposite to a conductive type of the source/drain region.

DETAILED DESCRIPTION

Specific implementation modes of a semiconductor device and a method for manufacturing the same in the disclosure will be described below in detail with reference to the drawings.

With shrinkage of a chip size and the improvement of the integration level, a load effect risk of etching may be increased significantly caused by the gate of the transistor being arranged on the silicon substrate, and the channel length defined by the photoetching may not be flexibly and finely adjusted according to a practical condition in a manufacturing procedure (a photomask needs to be reformed). In addition, oblique incidence doping of the source/drain may cause an electrical failure due to shield of a photoresist, and the silicon oxide shallow trenches for isolation among the transistor devices may be likely to generate grooves due to influence of a subsequent cleaning process, so as to cause a gate short or a wire short.

Therefore, the manufacturing procedure needs to be improved, to overcome various shortcomings in the related manufacturing procedure of the transistor devices.

The present disclosure is intended to provide a semiconductor device and a method for manufacturing the same, to overcome various shortcomings in a related manufacturing procedure of transistor devices and to improve the performance of semiconductor devices.

Figure 1:
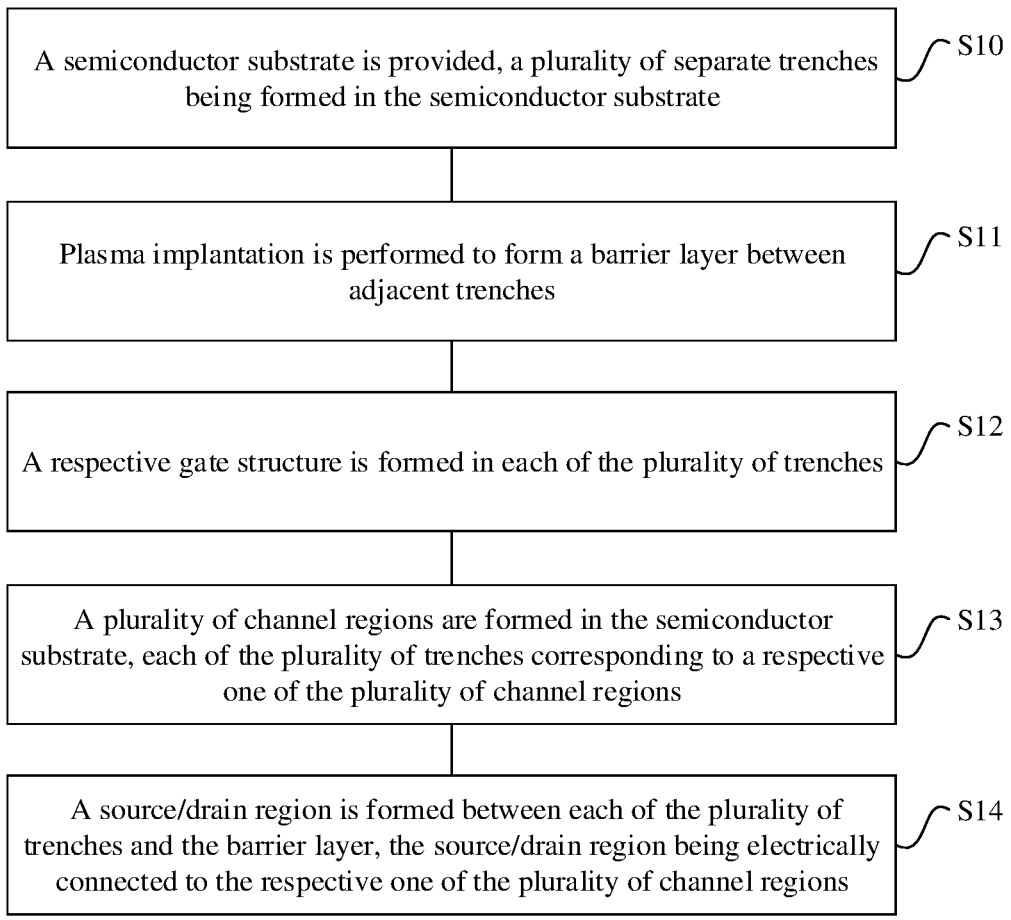
FIG. 1 is a schematic diagram of operations of a method for manufacturing a semiconductor device according to an embodiment of the disclosure.

FIG. 1 is a schematic diagram of operations of a method for manufacturing a semiconductor device according to an embodiment of the disclosure. Referring to FIG. 1, the method for manufacturing the semiconductor device in the disclosure includes the following operations. At S10, a semiconductor substrate is provided, a plurality of separate trenches being formed in the semiconductor substrate. At S11, plasma implantation is performed to form a barrier layer between adjacent trenches. At S12, a respective gate structure is formed in each of the plurality of trenches. At S13, a plurality of channel regions are formed in the semiconductor substrate, each of the plurality of trenches corresponding to a respective one of the plurality of channel regions. At S14, a source/drain region is formed between each of the plurality of trenches and the barrier layer, the source/drain region being electrically connected to the respective one of the plurality of channel regions.

FIG. 2 to FIG. 10 are process flowcharts illustrating a method for manufacturing a semiconductor device according to an embodiment of the disclosure.

Figure 2:
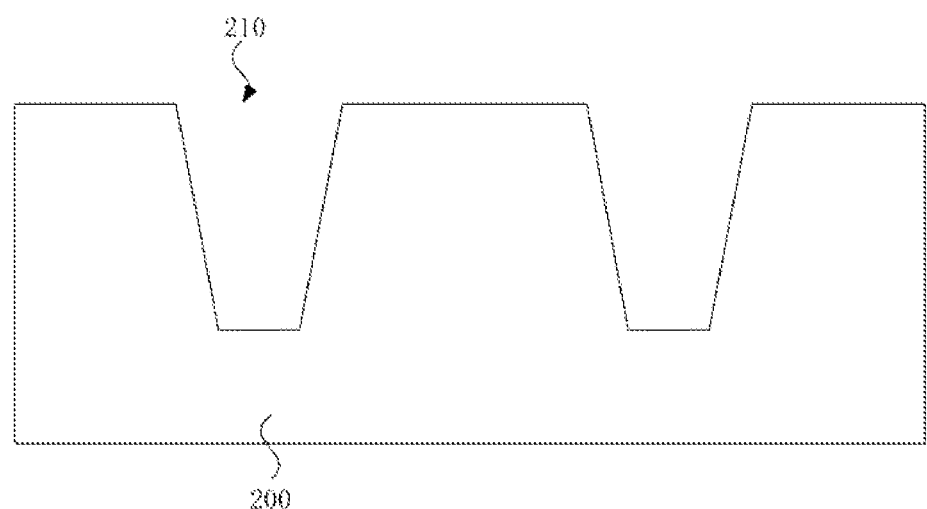
FIG. 2 to FIG. 10 are process flowcharts illustrating a method for manufacturing a semiconductor device according to an embodiment of the disclosure.

Referring to S10 and FIG. 2, a semiconductor substrate 200 is provided, a plurality of separate trenches 210 being formed in the semiconductor substrate 200. The semiconductor substrate 200 may be a semiconductor substrate such as silicon or germanium semiconductor substrate. In the embodiment, description will be made by taking a silicon substrate as the semiconductor substrate 200.

At this operation, the trench 210 is formed by photoetching and etching processes. Specifically, at this operation, a mask layer and a patterned photoresist layer are formed on the semiconductor substrate 200. Patterns of the photoresist layer are transferred to the mask layer. The semiconductor substrate 200 is etched by using the mask layer as a mask to form the trench 210. After the trench 210 is formed, the mask layer is removed.

Figure 3:
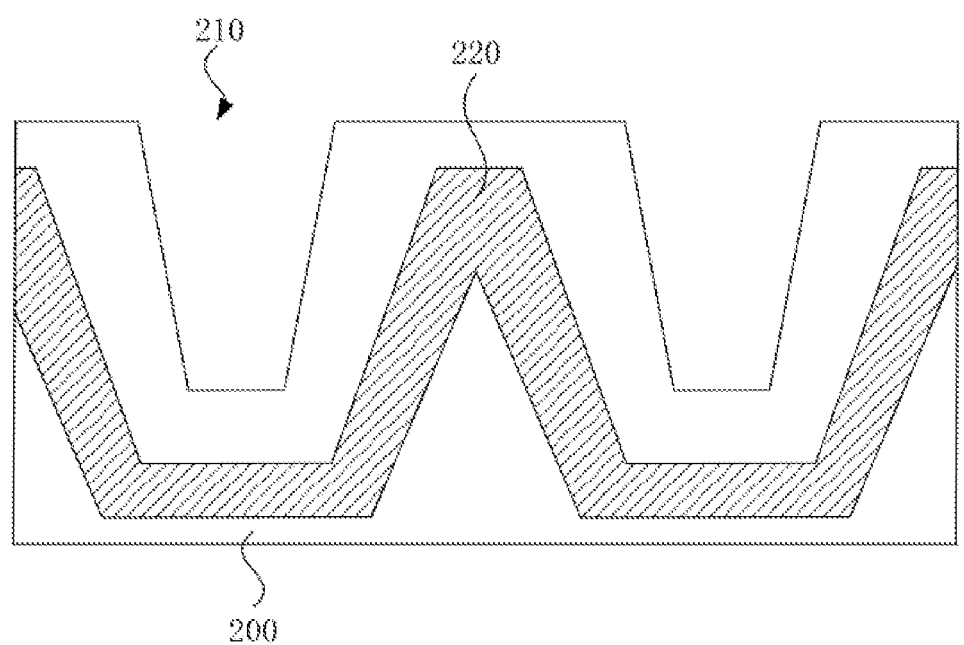

Referring to S11 and FIG. 3, the plasma implantation is performed to form the barrier layer 220 between the adjacent trenches 210. At this operation, the plasma implantation is performed in the semiconductor substrate 200 to form the barrier layer 200 in the semiconductor substrate 200. The barrier layer 220 serves as an isolation layer for isolating the source/drain regions of adjacent transistors formed by the manufacturing method of the disclosure, to avoid electrical leakage.

In the embodiment, when performing the plasma implantation process, the semiconductor substrate 200 is not shielded. In such way, the barrier layer 220 formed in the semiconductor substrate 200 is arranged around an outer surface of the trench 210, and a distance between the barrier layer 220 and the outer surface of the trench 210 is greater than 0. The distance between the barrier layer 220 and the outer surface of the trench 210 and a thickness of the barrier layer 220 are determined by performance of a finally formed semiconductor device. Herein, the distance (i.e., a depth of the plasma implantation) between the barrier layer 220 and the outer surface of the trench 210 and the thickness of the barrier layer 220 may be adjusted by changing at least one of: energy of the plasma implantation, an dose or an element type of the implanted plasma, or a grain boundary of the semiconductor substrate 200.

Furthermore, in the embodiment, the plasma implantation process adopts a vertical implantation method. By using the vertical implantation, the barrier layer 220 may be distributed on two sides of the trench 210 uniformly and symmetrically. When the barrier layer 220 is distributed on the two sides of the trench 210 asymmetrically, for example, the barrier layer on one side is closer to the trench and the barrier layer on the other side is farer from the trench, the barrier layer 220 closer to the trench may be overlapped with the source/drain region subsequently formed and thus may lead to a failure.

In another embodiment of the disclosure, when the plasma implantation process is performed, the semiconductor substrate 200 is partially shielded, only a region between the adjacent trenches 210 is exposed, and a width of the exposed region is less than a width between the adjacent trenches 210. In such way, after the plasma implantation, the barrier layer is formed only in the exposed region, and the distance between the barrier layer and the outer surface of the trench is greater than 0, and there is no barrier layer formed in any other region.

For forming an N-type semiconductor device, at the operation, a conductive type of the implanted plasma is P type. For forming a P-type semiconductor device, at the operation, the conductive type of the implanted plasma is N type.

In the related art, an isolation structure of a shallow trench is used as a layer for isolation between source/drain regions of adjacent transistors, and defects may be generated in the isolation structure of the shallow trench due to subsequent manufacturing procedures such as cleaning, which may result in that active areas contact with each other due to an effect of surface tension, and cause short circuits between the active areas. In the disclosure, no isolation structure of the shallow trench needs to be formed, instead, the barrier layer formed by plasma implantation is used as an isolation layer for isolating the source/drain regions of adjacent transistors. Since ions implanted for forming the source/drain region and the barrier layer are of opposite types, a PN junction is formed between the source/drain region and the barrier layer, and a built-in electric field of the PN junction may prevent electrons from diffusion and further have an isolation effect. The longer the distance between adjacent transistors, the better the isolation effect of the barrier layer 220.

Figure 6:
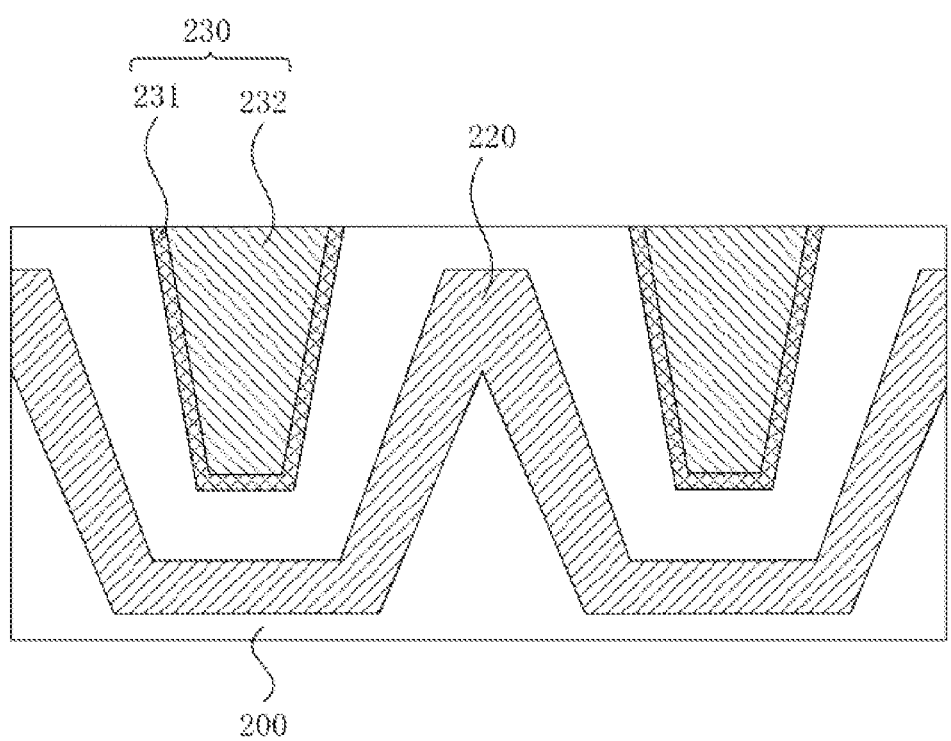

Referring to S12 and FIG. 6, the respective gate structure 230 is formed in the each of the plurality of trenches 210.

The gate structure 230 includes a gate insulating layer 231 and a gate 232. In the embodiment, the operation for forming the gate structure further includes the following actions.

Figure 4:
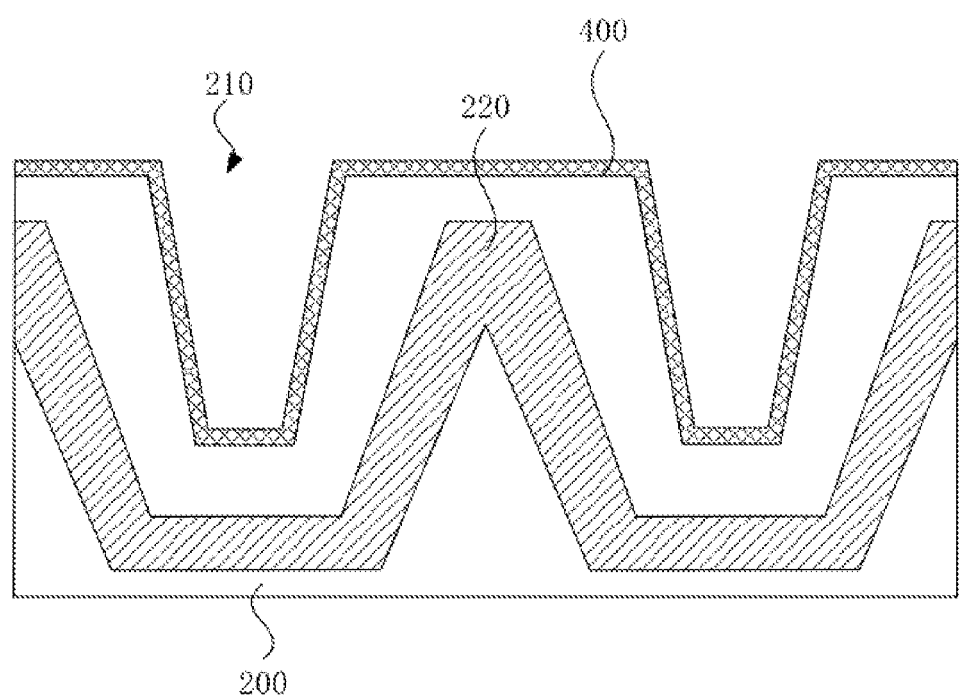

Referring to FIG. 4, a gate insulating material 400 is provided in the trench 210, the gate insulating material 400 covers a sidewall of the trench 210 and a surface of the semiconductor substrate 200. The gate insulating material 400 may comprise an oxide or a nitride. The gate insulating material 400 may be formed by a process of In-Situ Steam Generation (ISSG), Atomic Layer Deposition (ALD), or thermal oxidation. A specific thickness of the gate insulating material is determined by a device voltage. For example, in the embodiment, the thickness of the gate insulating material 400 is 2 nm to 10 nm. In the embodiment, the gate insulating material 400 is formed by the ALD process, and the gate insulating material 400 is a silicon oxide.

Figure 5:
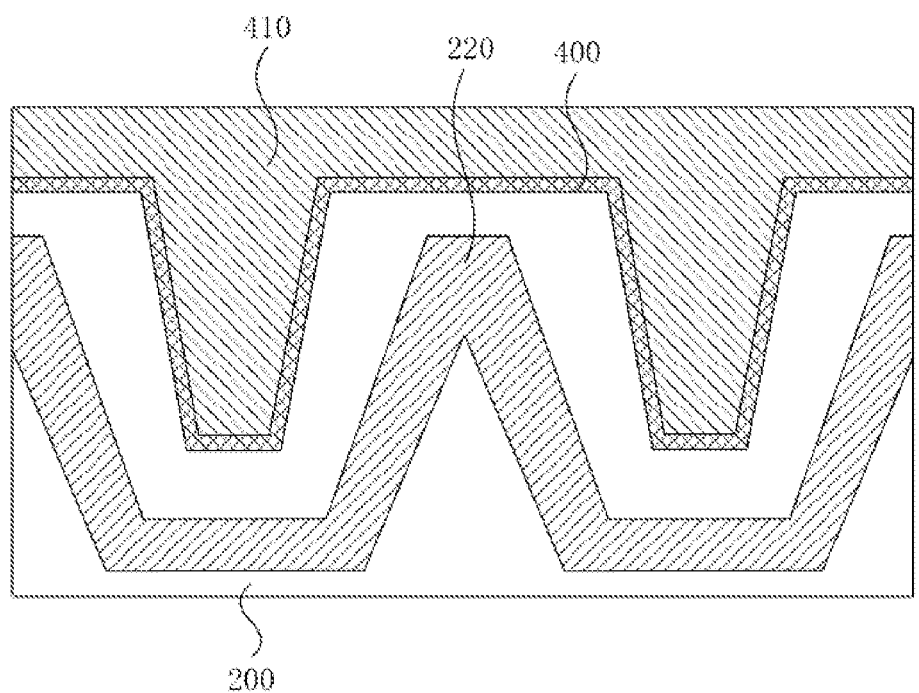

Referring to FIG. 5, the trench 210 is filled with a conductive material 410, the conductive material 410 fills up the trench and covers the gate insulating material 400 on the surface of the semiconductor substrate 200. The conductive material 410 may be a conventional material used for forming the gate, for example, polysilicon. At this action, the conductive material 410 may be formed by using a Low-Pressure Chemical Vapor Deposition (LPCVD) process.

Referring to FIG. 6, the conductive material 410 and the gate insulating material 400 on the surface of the semiconductor substrate 200 are removed to form the gate insulating layer 231 and the gate 232 in the trench 210. Specifically, at this action, the conductive material 410 and the gate insulating material 400 on the surface of the semiconductor substrate 200 may be removed by using processes of etching back, chemical mechanical polishing, and cleaning. The gate insulating layer 231 covers the sidewall of the trench 210, and the gate 232 covers the gate insulating layer 231 and fills up the trench 210.

Figure 7:
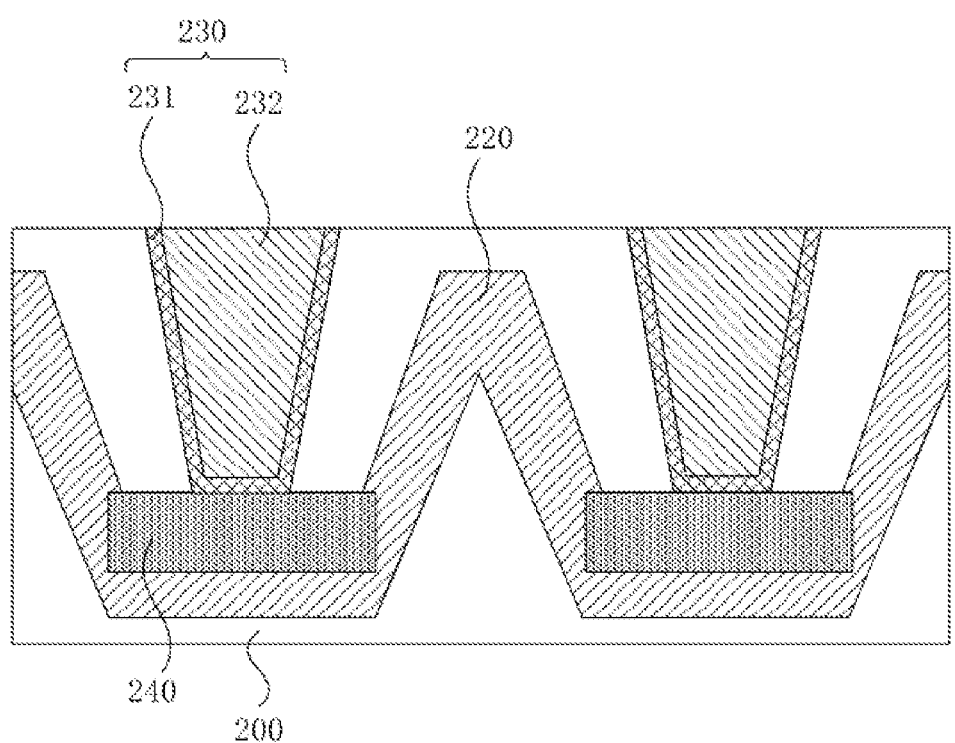

Referring to S13 and FIG. 7, the plurality of channel regions 240 are formed in the semiconductor substrate 200, each of the plurality of trenches 210 corresponding to a respective one of the plurality of channel regions 240. The barrier layer 220 separates the semiconductor substrate into a plurality of regions and each of the regions is provided with the trench 210, and the channel region 240 is formed in the each of the regions in the semiconductor substrate 200.

In the embodiment, the channel region 240 is formed beneath the trench 210 in the semiconductor substrate 200 and formed on side surfaces of the trench 210 in the semiconductor substrate 200, i.e., the channel region 240 extends upwards along the sidewall of the trench 210. It can be understood that, in order to form the source/drain region subsequently, the channel region 240 is only formed on some of the side surface of the trench 210. In another embodiment of the disclosure, the channel region 240 may be only formed beneath the trench 210 in the semiconductor substrate 200.

Furthermore, in the embodiment, as illustrated in FIG. 7, the semiconductor substrate 200 is partially shielded by the photoresist layer and the region where the channel region needs to be formed is exposed. The plasma implantation is performed in the semiconductor substrate 200 to form the channel region 240. A depth and a thickness of the formed channel region 240 may be adjusted by changing at least one of: the energy of the plasma implantation, the dose or the element type of the implanted plasma, or the grain boundary of the semiconductor substrate 200. A width of the channel region 240 may be controlled by controlling a width of an opening of the photoresist layer.

Furthermore, in the embodiment, the plasma implantation process adopts the vertical implantation method. By using the vertical implantation, the channel region 240 may be formed directly beneath the trench 210 and distributed symmetrically, which may further ensure a length of a channel. When the plasma implantation process adopts oblique incidence, the formed channel region 240 may also be oblique, which may make it impossible to electrically connect the source/drain region with the channel region and further affect the performance of the device. Furthermore, the width of the channel region 240 is greater than the width of the trench 210, to ensure the length of the channel. When the width of the channel region 240 is small, it is necessary to implant the source/drain region at a deeper position to form an electrical connection, in such way, the length of the channel may be too small and the performance of the semiconductor device may be reduced.

Figure 8:
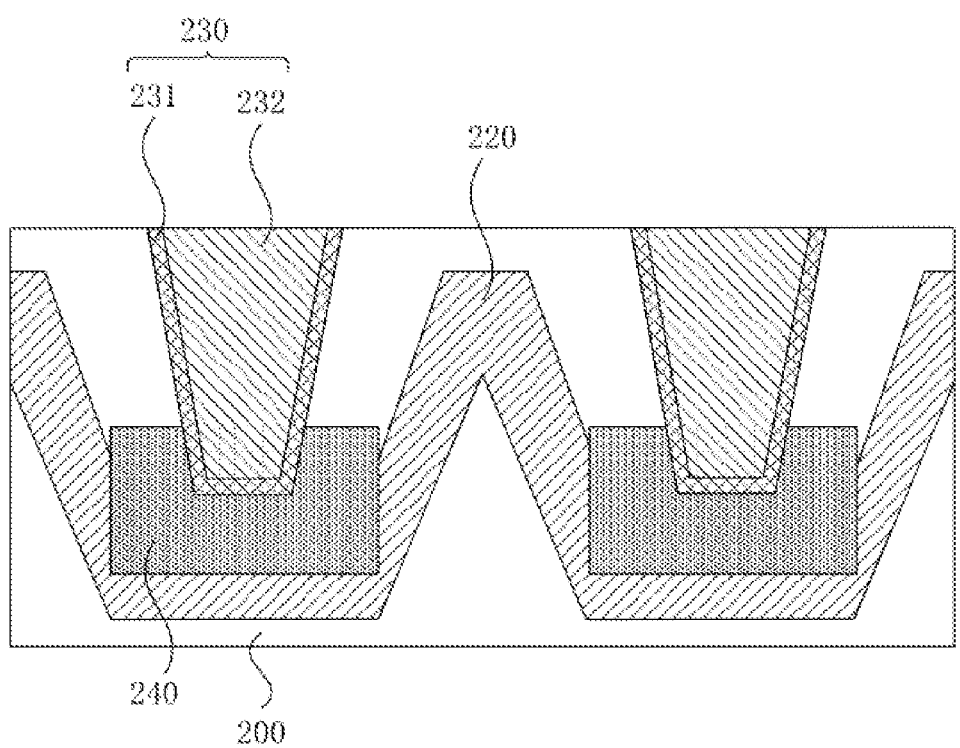

Furthermore, referring to FIG. 8, in the embodiment, annealing is performed after the plasma implantation to enable ions in the channel region 240 to diffuse upwards, to form the channel region 240 that extends upwards along the sidewall of the trench 210. The channel region 240 is arranged correspondingly to a bottom and side surfaces of the trench 210, so that the source/drain region 250 (illustrated in FIG. 9) contacts with the channel region 240, meanwhile, an overlapping area between the channel region 240 and the gate structure 230 is increased, and the length of the channel (the length H of the channel being illustrated in FIG. 10) is further increased.

In another embodiment of the disclosure, a plasma implantation depth is changed to enable the channel region 240 to extend upwards along a sidewall of the trench 210. The plasma implantation depth is gradually decreases with the decrease of the depth of the trench 210, to form the channel region 240 that extends upwards along the sidewall of the trench 210 and avoid the plasma is implanted into the gate structure 230. For example, a trench depth at a bottom of the trench 210 with an oblique sidewall is maximum, and correspondingly, the plasma implantation depth is maximum; and with a trench depth of the sidewall of the trench 210 with an oblique sidewall reduces, the plasma implantation depth gradually reduces.

Furthermore, the plasma forming the barrier layer 220 and the plasma forming the plurality of channel regions 240 are ions of the same conductive type, that is, the barrier layer 220 and the channel region 240 are of the same conductive type. For example, for forming an N-type semiconductor device, at the operation, a conductive type of the implanted plasma is P type, and for forming a P-type semiconductor device, at the operation, the conductive type of the implanted plasma is N type.

Figure 9:
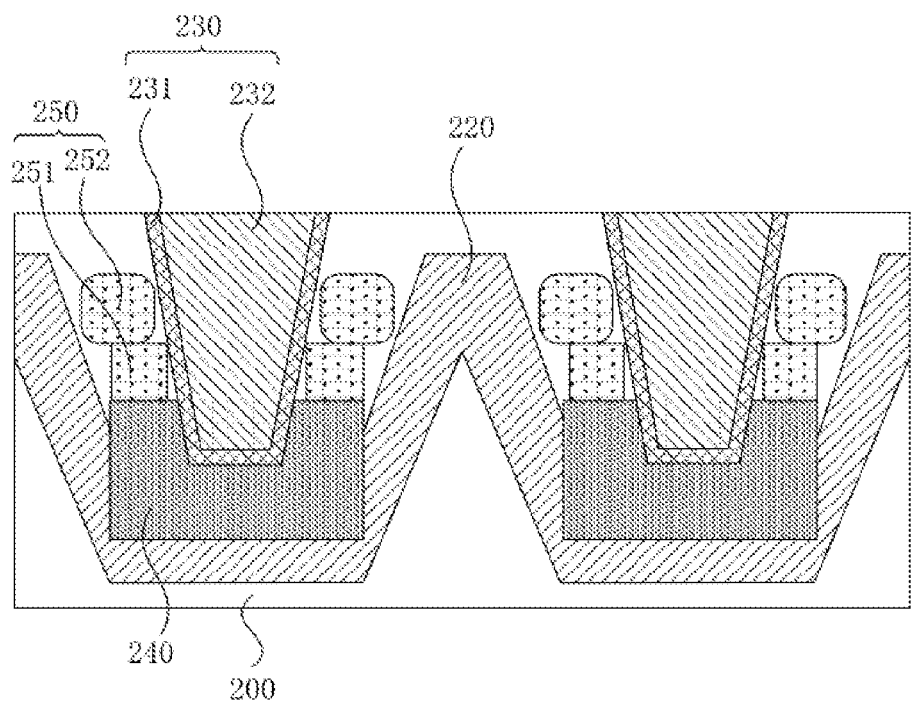

Referring to S14 and FIG. 9, the source/drain region 250 is formed between each of the plurality of trenches 210 and the barrier layer 220, the source/drain region 250 being electrically connected to the respective one of the plurality of channel regions 240. The source/drain region 250 being electrically connected to the channel region 240 means that when a voltage is applied to the gate structure 230, the channel region 240 is on, and charge carriers flow between a source and a drain to form a current.

A gap is provided between the trench 210 and the barrier layer 220 and is configured to form the source/drain region 250. The conductive type of the source/drain region 250 is opposite to the conductive type of the barrier layer 220. For example, for forming the N-type semiconductor device, the conductive type of the source/drain region 250 is N type, and the conductive type of the barrier layer 220 is P type; and for forming the P-type semiconductor device, the conductive type of the source/drain region 250 is P type, and the conductive type of the barrier layer 220 is N type. A PN junction is formed between the source/drain region 250 and the barrier layer 220 form, and a built-in electric field of the PN junction can prevent electrons from diffusion and have an isolation effect.

Furthermore, in the embodiment, the semiconductor substrate 200 is partially shielded by a structure such as the photoresist layer, and only the region where the source/drain region 250 needs to be formed is exposed, i.e., a spacing region between the trench 210 and the barrier layer 220 is exposed. Then the plasma implantation is performed in the exposed region of the semiconductor substrate 200 to form the source/drain region 250. A depth and a width of the source/drain region 250 are determined by the performance of the semiconductor device. The depth and a concentration of the source/drain region 250 may be adjusted by changing at least one of: the energy of the plasma implantation, the dose or the element type of the implanted plasma, or the grain boundary of the semiconductor substrate 200.

In the related art, the source/drain region is formed by an oblique incidence doping process, and the oblique incidence doping may cause an electrical failure due to the shield of the photoresist. According to the manufacturing method of the disclosure, the source/drain region 250 is formed by the plasma implantation process rather than the oblique incidence doping process. Therefore, the electrical failure can be avoided since there is no shield of the photoresist, and the performance of the semiconductor device can be improved.

Furthermore, in the embodiment, the source/drain region 250 includes a lightly doped drain 251 and a source/drain 252. The source/drain 252 is electrically connected to the respective one of the plurality of channel regions 240 through the lightly doped drain 251, i.e., the lightly doped drain 251 is beneath the source/drain 252 and is electrically connected to the channel region 240. In the embodiment, the lightly doped drain 251 may be formed by using the plasma implantation process, and then a plasma implantation parameter may be changed to form the source/drain 252. Both of the lightly doped drain 251 and the source/drain 252 may be formed by using the plasma implantation process. Compared with the lightly doped drain and the source/drain being formed by oblique incidence doping many times in the related art, the lightly doped drain 251 and source/drain 252 performance formed according to the manufacturing method of the disclosure can have better conductivity.

Figure 10:
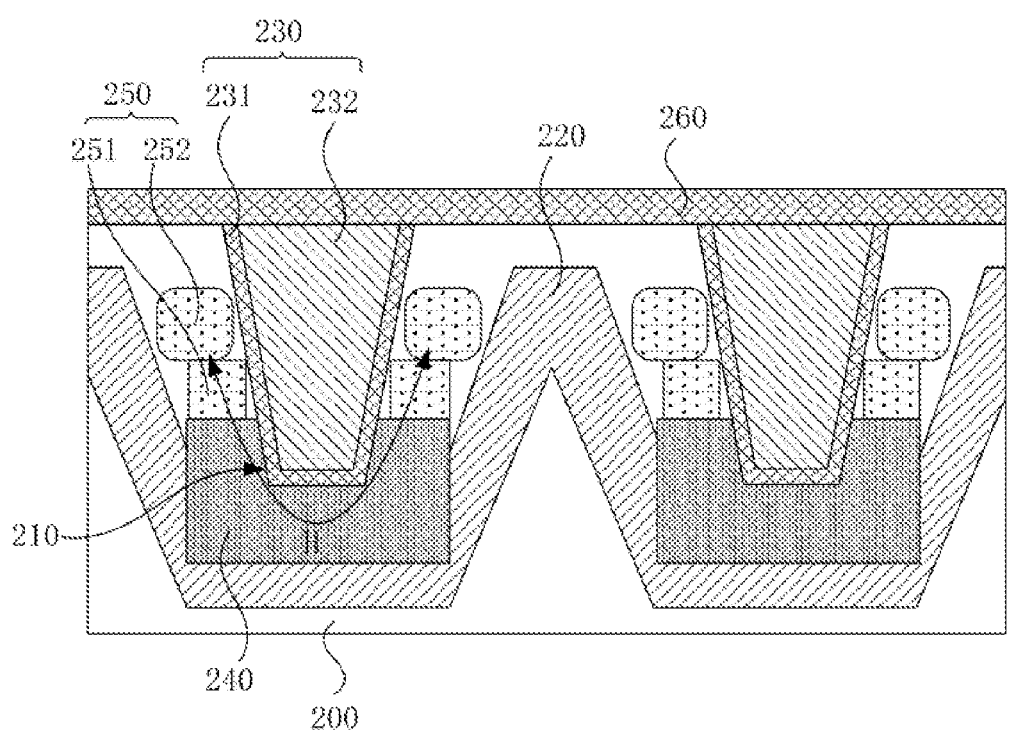

Furthermore, referring to FIG. 10, the method may include the following operation. After the source/drain region 250 is formed between each of the plurality of trenches 210 and the barrier layer 220, a passivation layer 260 is formed, the passivation layer 260 covering a surface of the semiconductor substrate 200 and a surface of the gate structure 230. The passivation layer 260 is configured to isolate the gate structure 230 from the outside, and plays a protective role. The passivation layer 260 includes, but not limited to, nitride such as silicon nitride, and may be formed by using the LPCVD process.

In the related art, the length of the channel is usually defined by photoetching, and when the formed semiconductor device has a poor electrical property, the length of the channel needs to be adjusted, then the photomask needs to be reformed. However, reform of the photomask is costly and time-consuming According to the manufacturing method of the disclosure, the length of the channel (for example, H in FIG. 10) of the semiconductor device can be determined by the depth of the trench 210 and the depth of the source/drain region 250. The length of the channel may be adjusted directly by an etching depth of the trench 210 and the plasma implantation depth of the source/drain region 250, and may be finely adjusted at anytime. Therefore, according to the manufacturing method of the disclosure, the production cost can be greatly reduced, and the time consumption is low, in addition, the photomask can be reduced and thus process operations can be reduced.

The disclosure also provides a semiconductor device manufactured by the abovementioned manufacturing method. Referring to FIG. 10, in an embodiment of the disclosure, the semiconductor device includes a semiconductor substrate 200, a barrier layer 220, a gate structure 230, a channel region 240, and a source/drain region 250. The gate structure 230, the channel region 240, and the source/drain region 250 are configured to form a transistor.

A plurality of separate trenches 210 is formed in the semiconductor substrate 200. The semiconductor substrate 200 may be a semiconductor substrate such as a silicon or germanium substrate. In the embodiment, the semiconductor substrate 200 is a silicon substrate.

The barrier layer 220 is formed between adjacent trenches 210 by using a plasma implantation process. The barrier layer 220 serves as an isolation layer between adjacent transistors. A gap is provided between the trench 210 and the barrier layer 220. In the embodiment, the barrier layer 220 is formed around an outer surface of the trench 210, and the gap between the barrier layer 220 and the outer surface of the trench 210 is greater than 0. In another embodiment of the disclosure, the barrier layer 220 is only formed between adjacent transistors rather than around the outer surface of the trench 210.

The gate structure 230 is formed in the trench 210. The gate structure 230 includes a gate insulating layer 231 covering a sidewall of the trench 210 and a gate 232 filling the trench 210. The gate insulating layer 231 serves as an isolation layer which isolates the gate 232 from the channel region 240 and the source/drain region 250.

A plurality of channel regions 240 are formed in the semiconductor substrate 200, each of the plurality of trenches 210 corresponding to a respective one of the plurality of channel regions 240. In the embodiment, the channel region 240 is arranged at a bottom of the trench 210, and extends upwards along the sidewall of the trench 210. It can be understood that, in order to provide an enough space for forming the source/drain region 250, the channel region 240 is only formed on some of a side surface of the trench 210. In another embodiment of the disclosure, the channel region 240 may be only formed beneath the trench 210 in the semiconductor substrate 200.

Furthermore, a width of the channel region 240 is greater than a width of the trench 210, so as to increase a contact area between the source/drain region 250 and the channel region 240. When the width of the channel region 240 is small, the source/drain region needs to be formed at a deeper position, in such way, the length of the channel may be too small and the performance of the semiconductor device may be reduced.

The source/drain region 250 is formed between each of the plurality of trenches 210 and the barrier layer 220 and is electrically connected to the respective one of the plurality of channel regions 240. The source/drain region 250 is formed in a spacing region between the trench 210 and the barrier layer 220. A conductive type of the barrier layer 220 is opposite to a conductive type of the source/drain region 250. For example, for forming an N-type semiconductor device, the conductive type of the source/drain region 250 is N type, and the conductive type of the barrier layer 220 is P type; and for forming a P-type semiconductor device, the conductive type of the source/drain region 250 is P type, and the conductive type of the barrier layer 220 is N type. A PN junction is formed between the source/drain region 250 and the barrier layer 220, and a built-in electric field of the PN junction can prevent electrons from diffusion and have an isolation effect.

Furthermore, in the embodiment, the source/drain region 250 includes a lightly doped drain 251 and a source/drain 252. The source/drain 252 is electrically connected to the respective one of the plurality of channel regions 240 through the lightly doped drain 251, i.e., the lightly doped drain 251 is beneath the source/drain 252 and is electrically connected to the channel region 240.

Furthermore, the semiconductor device further includes a passivation layer 260, the passivation layer 260 covering a surface of the semiconductor substrate 200 and a surface of the gate structure 230. The passivation layer 260 is configured to isolate the gate structure 230 from the outside, and plays a protective role. The passivation layer 260 includes, but not limited to nitride such as silicon nitride.

The semiconductor device of the disclosure has a good electricity performance, a low process cost and is easy to prepare.

The embodiments of the disclosure have the following advantages. In the related art, an isolation structure of a shallow trench is used as a layer for isolation between source/drain regions of adjacent transistors, and defects may be generated in the isolation structure of the shallow trench due to subsequent manufacturing procedures such as cleaning, which may result in that active areas contact with each other due to an effect of surface tension, and cause short circuits between the active areas. In the disclosure, no isolation structure of the shallow trench needs to be formed, instead, the barrier layer formed by plasma implantation is used as an isolation layer for isolating the source/drain regions of adjacent transistors. Since ions implanted for forming the source/drain region and the barrier layer are of opposite types, a positive-negative (PN) junction is formed between the source/drain region and the barrier layer, and a built-in electric field of the PN junction can prevent electrons from diffusion and further have an isolation effect. According to the method of the disclosure, various shortcomings in the related manufacturing procedure of the transistor devices can be overcome, and the performance of the semiconductor device can be improved.

The foregoing is only the preferred implementation modes of the disclosure. It is noted that those of ordinary skill in the art may further make many improvements and modifications without departing from the principle of the disclosure, and these improvements and modifications shall also fall within the scope of protection of the disclosure.

INDUSTRIAL APPLICABILITY

In the embodiments of the disclosure, a semiconductor substrate is provided, a plurality of separate trenches being formed in the semiconductor substrate. Plasma implantation is performed to form a barrier layer between adjacent trenches. A respective gate structure is formed in each of the plurality of trenches. A plurality of channel regions are formed in the semiconductor substrate, each of the plurality of trenches corresponding to a respective one of the plurality of channel regions. A source/drain region is formed between each of the plurality of trenches and the barrier layer, the source/drain region is electrically connected to the respective one of the plurality of channel regions, and a conductive type of the barrier layer being opposite to a conductive type of the source/drain region. In such way, no isolation structure of the shallow trench needs to be formed, instead, the barrier layer formed by plasma implantation is used as an isolation layer for isolating the source/drain regions of adjacent transistors. Since ions implanted for forming the source/drain region and the barrier layer are of opposite types, a PN junction is formed between the source/drain region and the barrier layer, and a built-in electric field of the PN junction can prevent electrons from diffusion and further have an isolation effect.

The invention claimed is:

1. A method for manufacturing a semiconductor device, comprising:
    providing a semiconductor substrate, a plurality of separate trenches being formed in the semiconductor substrate;
    performing plasma implantation to form a barrier layer between adjacent trenches of the plurality of separate trenches, wherein the barrier layer is formed around an outer surface of a trench of the plurality of separate trenches, a gap is provided between the barrier layer and the outer surface of the plurality of separate trenches, and the barrier layer between the adjacent trenches is interconnected with each other;
    forming a respective gate structure in each of the plurality of separate trenches;
    forming a plurality of channel regions in the semiconductor substrate, each of the plurality of separate trenches corresponding to a respective one of the plurality of channel regions; and
    forming a source/drain region between each of the plurality of separate trenches and the barrier layer, the source/drain region being electrically connected to the respective one of the plurality of channel regions, a distance between the surface of the semiconductor substrate and the top of the source/drain region is greater than a distance between the surface of the semiconductor substrate and the top of the barrier layer; and a conductive type of the barrier layer is opposite to a conductive type of the source/drain region, but the same as the conductive type of the channel regions; and
    forming a PN junction between the source/drain region and the barrier layer, a built-in electric field of the PN junction can prevent electrons from diffusion.

2. The method for manufacturing the semiconductor device of claim 1, wherein the respective gate structure comprises a gate insulating layer and a gate, and forming the respective gate structure in each of the plurality of separate trenches comprises:
    providing a gate insulating material in a corresponding trench of the plurality of separate trenches, the gate insulating material covering a sidewall of the corresponding trench and a surface of the semiconductor substrate;
    filling the corresponding trench with a conductive material, the conductive material filling up the corresponding trench and covering the gate insulating material on the surface of the semiconductor substrate; and
    removing the conductive material and the gate insulating material on the surface of the semiconductor substrate to form the gate insulating layer and the gate in the corresponding trench.

3. The method for manufacturing the semiconductor device of claim 1, wherein forming the plurality of channel regions in the semiconductor substrate comprises:
    performing second plasma implantation in the semiconductor substrate to form the plurality of channel regions.

4. The method for manufacturing the semiconductor device of claim 3, wherein a width of a channel region of the plurality of channel regions is greater than a width of a corresponding trench of the plurality of separate trenches.

5. The method for manufacturing the semiconductor device of claim 4, further comprising:
    after the second plasma implantation, performing annealing to enable the channel region to extend upwards along a sidewall of the corresponding trench.

6. The method for manufacturing the semiconductor device of claim 4, further comprising:
    changing a depth of the second plasma implantation to enable the channel region to extend upwards along a sidewall of the corresponding trench.

7. The method for manufacturing the semiconductor device of claim 1, wherein forming the source/drain region between each of the plurality of separate trenches and the barrier layer comprises:
    performing second plasma implantation in the semiconductor substrate to form a lightly doped drain and a source/drain, the source/drain being electrically connected to the respective one of the plurality of channel regions through the lightly doped drain.

8. The method for manufacturing the semiconductor device of claim 1, further comprising:
    after forming the source/drain region between each of the plurality of separate trenches and the barrier layer,
    forming a passivation layer, the passivation layer covering a surface of the semiconductor substrate and a surface of the respective gate structure.

9. A semiconductor device, comprising:
    a semiconductor substrate, a plurality of separate trenches being formed in the semiconductor substrate;
    a barrier layer formed between adjacent trenches of the plurality of separate trenches by a plasma implantation process, wherein the barrier layer is formed around an outer surface of a trench of the plurality of separate trenches, a gap is provided between the barrier layer and the outer surface of the plurality of separate trenches, and the barrier layer between the adjacent trenches is interconnected with each other;
    a respective gate structure formed in each of the plurality of separate trenches;
    a plurality of channel regions formed in the semiconductor substrate, each of the plurality of separate trenches corresponding to a respective one of the plurality of channel regions; and
    a source/drain region formed between each of the plurality of separate trenches and the barrier layer and electrically connected to the respective one of the plurality of channel regions, a distance between the surface of the semiconductor substrate and the top of the source/drain region is greater than a distance between the surface of the semiconductor substrate and the top of the barrier layer;

a conductive type of the barrier layer is opposite to a conductive type of the source/drain region, but the same as the conductive type of the channel regions; and a PN junction is formed between the source/drain region and the barrier layer, a built-in electric field of the PN junction can prevent electrons from diffusion.

10. The semiconductor device of claim 9, wherein the respective gate structure comprises a gate insulating layer covering a sidewall of a trench of the plurality of separate trenches and a gate filling the trench.

11. The semiconductor device of claim 9, wherein a width of a channel region of the plurality of channel regions is greater than a width of a corresponding trench of the plurality of separate trenches.

12. The semiconductor device of claim 9, wherein each of the plurality of channel regions is arranged at a bottom of a respective one of the plurality of separate trenches, and extends upwards along a sidewall of the respective one of the plurality of separate trenches.

13. The semiconductor device of claim 9, further comprising a passivation layer, the passivation layer covering a surface of the semiconductor substrate and a surface of the respective gate structure.

* * * * *